(12) United States Patent
Webb

(10) Patent No.: US 11,476,604 B2
(45) Date of Patent: Oct. 18, 2022

(54) FLEXIBLE CONNECTOR

(71) Applicant: STRIP TINNING LIMITED, Birmingham (GB)

(72) Inventor: Matthew Webb, Birmingham (GB)

(73) Assignee: Strip Tinning Limited, Birmingham (GB)

( * ) Notice: Subject to any disclaimer, the term of this patent is extended or adjusted under 35 U.S.C. 154(b) by 246 days.

(21) Appl. No.: 16/664,347

(22) Filed: Oct. 25, 2019

(65) Prior Publication Data

US 2020/0136283 A1 Apr. 30, 2020

(30) Foreign Application Priority Data

Oct. 25, 2018 (GB) ...................................... 1817357

(51) Int. Cl.

| | | |
|---|---|---|
| *H05B 3/84* | (2006.01) | |
| *H01R 12/62* | (2011.01) | |
| *B60R 16/03* | (2006.01) | |
| *H05K 1/11* | (2006.01) | |
| *H05B 3/86* | (2006.01) | |
| *B60J 1/00* | (2006.01) | |
| *H01Q 1/12* | (2006.01) | |
| *B60J 1/02* | (2006.01) | |
| *B60S 1/02* | (2006.01) | |

(52) U.S. Cl.
CPC .............. *H01R 12/62* (2013.01); *B60J 1/002* (2013.01); *B60R 16/03* (2013.01); *H01Q 1/1271* (2013.01); *H01Q 1/1278* (2013.01); *H05B 3/84* (2013.01); *H05B 3/86* (2013.01); *H05K 1/118* (2013.01); *B60J 1/02* (2013.01); *B60S 1/026* (2013.01)

(58) Field of Classification Search
CPC .......... H01R 12/62; H01R 4/02; H01R 11/01; H01R 4/04; H01R 13/6315; B60R 16/03; H05K 1/118; B60J 1/02; B60S 1/026; H05B 3/06; H05B 3/84; H05B 2203/016; B32B 17/10036
See application file for complete search history.

(56) References Cited

U.S. PATENT DOCUMENTS

| | | | | |
|---|---|---|---|---|
| 4,023,008 A | | 3/1977 | Durrssel | |
| 5,738,554 A | * | 4/1998 | Borger | ..................... H01R 4/02 |
| | | | | 219/203 |

(Continued)

FOREIGN PATENT DOCUMENTS

| | | |
|---|---|---|
| CN | 203589225 U | 5/2014 |
| EP | 1942703 A2 | 7/2008 |

(Continued)

OTHER PUBLICATIONS

English Translation WO2018104149, Saint GoBain, Ruel et al. (Year: 2018).*

(Continued)

*Primary Examiner* — Steven T Sawyer
(74) *Attorney, Agent, or Firm* — Caesar Rivise, PC

(57) ABSTRACT

A solder bridge (1) for a vehicle windscreen, the solder bridge (1) comprises a first foot portion (11A) for connection to a vehicle windscreen and a second foot portion (11B) for connection to a vehicle windscreen, the first foot portion (11A) and second foot portion (11B) being interconnected by a flexible electrically conductive body (12).

20 Claims, 4 Drawing Sheets
(1 of 4 Drawing Sheet(s) Filed in Color)

(56) References Cited

U.S. PATENT DOCUMENTS

| | | | |
|---|---|---|---|
| 5,894,409 A * | 4/1999 | Tanaka | G01G 19/08 |
| | | | 177/136 |
| 7,909,665 B2 | 3/2011 | Lyon | |
| 2010/0294566 A1* | 11/2010 | Reul | B32B 17/10036 |
| | | | 174/94 R |
| 2011/0163569 A1* | 7/2011 | Yoneyama | H01R 12/515 |
| | | | 296/146.1 |
| 2014/0182932 A1 | 7/2014 | Cholewa et al. | |
| 2015/0296615 A1 | 10/2015 | Schmalbuch et al. | |
| 2017/0033481 A1 | 2/2017 | Schmalbuch et al. | |
| 2017/0297130 A1* | 10/2017 | Jenrich | B23K 35/264 |
| 2018/0258920 A1* | 9/2018 | Kessler | H05B 3/06 |

FOREIGN PATENT DOCUMENTS

| | | |
|---|---|---|
| EP | 2299544 A1 | 3/2011 |
| GB | 2357638 A | 6/2001 |
| WO | 2012152542 A1 | 11/2012 |
| WO | 2013004434 A1 | 1/2013 |
| WO | 2015165632 A1 | 11/2015 |
| WO | 2017032972 A1 | 3/2017 |
| WO | 2018104149 A1 | 6/2018 |

OTHER PUBLICATIONS

Search Report under Section 17(5) for GB application No. GB 1817357.5 filed on Oct. 25, 2018.
English-language abstract of CN203589225U.

* cited by examiner

FLEXIBLE CONNECTOR

CROSS-REFERENCE TO RELATED APPLICATIONS

This application claims foreign priority under 35 U.S.C. 119 of Great Britain patent application Serial No. GB1817357.5 filed on Oct. 25, 2018.

BACKGROUND OF THE INVENTION

1. Field of Invention

This invention relates generally to flexible connectors. More specifically, although not exclusively, this invention relates to flexible connectors for facilitating electrical connection between a source of electrical power and a site of use of electrical power.

2. Description of Related Art

Electrical connectors may be used to provide electrical energy to fragile substrates, e.g. heated windscreens in motor vehicles. Heated windscreens typically comprise a fragile substrate with metal wires provided thereon and/or therein. The electrical energy supplied to the metal wires causes resistive heating, which heats the fragile substrate and melts snow or ice, and/or evaporates fog or mist to prevent inhibition of driver visibility.

Typically, a busbar is used to distribute electrical energy to the metal wires. One or more busbars (e.g. printed silver busbars) may be provided on the surface of a fragile substrate to provide an electrical pathway for the dispersal of electrical power. On the front windscreen of a vehicle these may be provided upon (or in the region of) a printed black obscuration strip. An electrical connection to the busbar is provided by means of a connector, which may be soldered to the busbar in order to provide an electrical connection to the source of electrical power (e.g. the vehicle's wiring system). Typically, the connector comprises a pair of feet for soldering to the glass, the feet being interconnected by a bridge (which remains distant from the glass) to which the electrical connection is made. These are called 'solder bridges' in the art. They are typically made by stamping from a sheet of material, of say 0.8 to 1.0 mm thickness. The sheet of material is sufficiently thick to provide a rigid solder bridge. One such solder bridge is disclosed in U.S. Pat. No. 7,909,665 which proposes an electrical connector formed from copper and comprising two connector feet joined by a raised bridge portion. Protrusions or dimples are provided at the base of each of the connector feet, which ensure that the main body of the foot is kept a set height above the busbar. The contact surface and the height of the dimples are formed to exact tolerances. Clearly the production to exacting tolerances is challenging to manufacture in large amounts.

Connectors for use with busbars in motor vehicle windscreens are subjected to a variety of thermal and mechanical stresses, both during manufacture and across the lifetime of the vehicle.

In use, the operating conditions experienced by a motor vehicle (and the components thereof) are harsh. For example, the expected lifetime of a motor vehicle is long and a motor vehicle has to be capable of operating in diverse environments. As such, it is subject to large seasonal and daily variations in temperature, humidity, as well as exposure to pollutants, cleaning products, salt (for example as a result of road clearing during winter) and so forth. Accordingly, the components which are used in motor vehicles need to be able to withstand such environments and changing conditions across their lifespan, or at least in terms of the prevailing warranty. This means that the components which are used in motor vehicles are rigorously tested and have to be fit-for-purpose, especially where those components are not easily changed after installation. It is a requirement that the components do not become susceptible to failure when exposed to environmental agents and/or the chemicals which are prevalent (salt, cleaning fluids and so on).

The process of soldering a connector to a busbar during the manufacture of a vehicle windscreen is known to cause thermal stresses in the fragile substrate of the windscreen. In this process, solder is brought into contact with the busbar and it is heated, melts and re-solidifies. As the melt-solidification process is undertaken it is necessary to ensure that the thermal and mechanical stresses exerted upon the fragile substrate do not cause damage.

Thermal and mechanical stresses are generated in the fragile substrate due to differences in the coefficient of thermal expansion (CTE) of one or more of the connector and solder and the fragile substrate. These stresses may result in damage to the fragile substrate, which may render the component unfit for purpose and it will therefore have to be replaced, resulting in considerable expense and waste of materials. It is also known to be possible for the mechanical and thermal stresses to result in failure of the connection between the connector and fragile substrate. Where the connection has failed, electrical connection to the electrical components may be interrupted or terminated.

Lead-free solders have replaced (or at least are replacing) the use of lead-based solders due to environmental concerns. However, lead-free solders are typically less ductile than lead-based equivalents, which exacerbate the thermal and mechanical stress caused by the difference in the coefficient of thermal expansion (CTE) between the fragile substrate and the connector.

To seek to address this issue efforts have been made to find materials for the connector with coefficients of thermal expansion (CTE) which match that of the glass to which they are to be affixed.

EP1942703 proposes a connector which uses titanium. However, in order to achieve adequate stability and processability it is proposed to use an excess of solder material which, in use can cause high mechanical stresses in the glass pane. US2015/0296615 and WO 2015/165632 both disclose a two-part connector, a bridge part formed of copper and a connection part for contacting the glass substrate fabricated from a chrome-containing steel with a coefficient of thermal expansion (CTE) which is similar to that of glass. Clearly the use of different materials requires complex manufacturing steps. US2014/0182932 and CN203589225U both disclose connectors for providing an electrical connection to fragile substrates, which are fabricated from a chromium-containing steel. WO2012/152542 and WO2013/004434 both disclose a connector for providing an electrical connection to fragile substrates, which are fabricated from iron-nickel alloys.

The concept underpinning much of the above prior art concentrates on the materials utilised so to ensure that the CTE of the foot contact portions of the solder bridge is as close to that of glass as possible to reduce stress during installation. If there is a significant mismatch, the region of glazing beneath one part of a foot may undergo a tensile stress whereas another region of the glazing may undergo a compressive stress. This can lead to damage, especially if the glass substrate is flawed.

SUMMARY OF INVENTION

It is therefore a first non-exclusive object of the invention to provide a connector for facilitating an electrical connection to a fragile substrate, e.g. a glass windshield, which is capable of withstanding the manufacturing and operating conditions experienced by a motor vehicle (and the components thereof) without leading to damage of the fragile substrate and/or failure of the electrical connection.

Accordingly, a first aspect of the invention provides a solder bridge for a vehicle windscreen, the solder bridge comprising a first foot portion for connection to a vehicle windscreen and a second foot portion for connection to a vehicle windscreen, the first foot portion and second foot portion being interconnected by a flexible electrically conductive body.

It is understood that a solder bridge is a term of the art. A solder bridge is a connector comprising a first foot portion and a second foot portion, both for connection to a vehicle windscreen, the feet being interconnected by a bridge (which remains distant from the glass) to which the electrical connection is made.

The term flexible takes its normal definition in this specification, wherein the flexible electrically conductive body is capable of bending easily without breaking. In this specification a flexible body is one which can be bent around a 2 cm diameter mandrel and, once the bending force is released, will adopt its pre-bent state without further intervention. In contrast, metal materials which are of, say, 0.3 mm thick and above are not capable of such flexibility.

The first foot portion and second foot portion and flexible electrically conductive body are preferably formed as an integral body, e.g. as a unitary body.

It has been surprisingly found by the inventors that the use of a solder bridge comprising a flexible electrically conductive body for use in a vehicle windscreen provides a robust electrical connection with significantly reduced residual stress between the windscreen (e.g. a glass substrate) and the solder bridge of the invention, in comparison to solder bridges of the prior art.

Moreover, because the solder bridge is thin, it takes less space (and protrudes less from the substrate) than a conventional solder bridge.

In embodiments, the critical stress area between the first foot portion and/or the second foot portion at a terminal portion of the first foot portion, and a fragile substrate may be less than $8 \times 10^{-4}$ mm$^2$, for example, less than $7 \times 10^{-4}$ mm$^2$, or less than $6 \times 10^{-4}$ mm$^2$, or less than $5 \times 10^{-4}$ mm$^2$, or less than $4 \times 10^{-4}$ mm$^2$, e.g. less than $3 \times 10^{-4}$ mm$^2$.

The flexible electrically conductive body may comprise at least one connecting portion for providing, in use, an electrical connection from the solder bridge to a source of electrical power, e.g. the vehicle's electrical system.

The connecting portion may further comprise a securement means, e.g. a potting compound, a crimped portion, e.g. crimped metal, or another means to secure the solder bridge to the source of electrical power.

In embodiments, the flexible electrically conductive body may be formed as a unitary body comprising the connecting portion, the first foot portion, and the second foot portion.

The flexible electrically conductive body may be fabricated from any suitable conductive material that is flexible. For example, the flexible electrically conductive body may comprise and/or be fabricated from a suitable metal, for example one of silver, copper, gold, aluminium. Clearly there is a balance between electrical conductivity on the one hand and cost of manufacture on the other. So, whilst silver and so on may be used, it is typically too expensive for mass manufacture and so we prefer to use copper.

The flexible electrically conductive body may be any suitable shape to enable it to be flexible. For example, the flexible electrically conducive body may be a flat connector. The flexible electrically conductive body may be fabricated from a metal strip or a metal foil, e.g. a copper, silver and/or gold strip, or a copper, silver, and/or gold foil.

The flexible electrically conductive body may be less than or equal to 100 microns (0.1 mm) thick, for example, less than or equal to 90 microns, or 80 microns, or 70 microns thick. In embodiments, the flexible electrically conductive body may be between 40 to 100 microns thick, e.g. from 45 to 95 microns thick, or from 45 to 90 microns thick, or from 50 to 80 microns thick, or from 50 to 90 microns thick, for example, from 60 to 80 microns thick, or from 65 to 75 microns thick. In an embodiment the flexible conductive body may be 70 microns thick.

It has been found that a solder bridge comprising a flexible electrically conductive body having a thickness of less than or equal to, preferably less than, 100 microns, is able to effectively facilitate an electrical connection to a fragile substrate, e.g. a glass windshield. The electrical connection formed in this way is capable of withstanding the manufacture and operating conditions experienced by a motor vehicle (and the components thereof) without leading to damage of the fragile substrate and/or failure of the electrical connection.

The solder bridge may be from, say 20 to 100 mm long, for example, from 30 to 90 mm long, or from 40 to 80 mm long, or 50 to 70 mm long, e.g. from 55 to 65 mm long, or 60 mm long. The solder bridge may be from 7.0 to 15 mm wide, for example, from 7.5 to 14 mm wide, or 8.0 to 13 mm, or 8.5 to 12 mm, or 9.0 to 11 mm, or 9.5 to 10 mm wide.

In an embodiment the first foot portion and/or second foot portion may have a maximum length dimension and a maximum width dimension. In an embodiment the first foot portion and/or second foot portion may be circular or rectangular, in plan. In an embodiment the first foot portion and/or second foot portion is from 4.0 to 15 mm, e.g. 5.0 to 12 mm, or 6.0 to 9.0 mm long, or 7.0 to 8.0 mm long. In an embodiment the first foot portion and/or second foot portion is from 4.0 to 15 mm wide, e.g. from e.g. 5.0 to 12 mm, or 6.0 to 9.0 mm long, or 7.0 to 8.0 mm wide.

The first foot portion, flexible electrically conductive body and second foot portion may together describe a dumb-bell or I-shape, in plan.

In embodiments, flexible electrically conductive body may be elongate and or have an longitudinal axis. In an embodiment the first foot portion and/or the second foot portion may extend transversely beyond the periphery of the flexible electrically conductive body, i.e., in a direction orthogonal to the longitudinal axis of the flexible electrically conductive body.

The flexible electrically conductive body may comprise more than one conductive material, e.g. a metal provided as a substrate and coated with a cover layer. In embodiments, the substrate may be coated in a cover layer of a thickness of say 0.1 to 10 microns, for example, less than 5 microns thick, e.g. 2-4 microns thick. The cover layer may comprise one or more of tin and/or silver. The cover layer may comprise plural layers, for example in succession a layer of tin and a layer of silver, or vice versa.

The solder bridge may be provided with insulation, for example electrical insulation. The insulation may protect against environmental damage. The insulation may be provided about the periphery of the solder bridge, for example, at the first foot portion and/or second foot portion for connection to a vehicle windscreen. The insulation may be provided by a layer that encases all major surfaces of the flexible connection element such that the solder bridge is at least substantially electrically insulated.

The insulation may comprise or be any suitable material known to the skilled person. For example, the insulating portion may comprise or be a polymer, e.g. formed from a polymer resin. Preferably, the insulation is a layer of temperature-stable plastics material, for example, polyimide. One such plastics material is polyimide. In embodiments, the insulation may be formed from Kapton® film supplied by E.I. Dupont of Delaware, USA.

The insulation may be a layer that is between 10 to 100 microns thick, for example, between 10 to 90 microns thick, or 10 to 80 microns thick, or 10 to 70 microns thick, or 10 to 60 microns thick, for example, between 10 to 50 microns thick, or 10 to 40 microns thick, or 10 to 30 microns thick, e.g. 20 to 30 microns thick, e.g. 25 microns thick. Preferably, the thickness of the insulation will be chosen so as to allow the solder bridge to retain its flexibility.

In embodiments in which the solder bridge comprises insulation, the total thickness of the solder bridge may be between 100 microns and 500 microns, for example, between 100 and 400 microns, between 100 and 300 microns, between 100 and 200 microns, or between 100 and 150 microns. Preferably, the solder bridge comprising insulation has a thickness of less than 200 microns, e.g. less than 180 microns, or less than 150 microns, e.g. less than or equal to 130 microns, for example, 120 microns.

The insulation may comprise a border, i.e. a portion that extends beyond the flexible electrically conductive body. The border may be, say between 0.5 to 2 mm wide, e.g. between 0.75 to 1.5 mm wide, or between 1.0 to 1.25 mm wide.

In one embodiment the flexible electrically conductive body is 58 mm long and 0.6 mm wide, the insulation is 60 mm long and 0.8 mm wide, such that the solder bridge comprises insulation that extends by 1 mm beyond the periphery of the flexible electrically conducive body.

In embodiments the solder bridge is flat and has a first major surface and a second major surface. The first major surface may be the intended fragile-substrate-facing surface.

The insulation may comprise one or more window(s) or opening(s) to expose the flexible electrically conductive body of the solder bridge.

A window or opening may be present in the insulation of the flexible electrically conductive body for providing, in use, an electrical connection between the solder bridge and a source of electrical power, e.g. the vehicle's electrical system. The window or opening in the insulation may be present, for example, on the second major surface.

The insulation may comprise one or more window(s) to expose the flexible electrically conductive body of the solder bridge.

A first window may be located on or proximate the first foot portion and/or a second window may be located on or proximate second foot portion. In embodiments, the first window and/or the second window may be located to facilitate connection of the first foot portion and/or second portion to the fragile substrate. For example, the first window and/or second window may be located on the first major surface.

In use, the first and/or second foot portion of the solder bridge for connection to a vehicle windscreen may be securable or secured directly to vehicle windscreen, for example an electrically conductive structure of the vehicle windscreen via a solder material, e.g. a solder deposit or a solder preform. Solder material may be provided on the first and/or second foot portions, preferably both. The solder material may be applied to the foot portion or foot portions in the region of the window(s). The solder material, may be larger, smaller or the same size as the window(s). Preferably the solder is larger than the window(s) to provide environmental protection to the underlying foot portion.

Preferably the solder material is lead-free. The solder compound may comprise one or more of silver, tin, bismuth, indium and copper. In one embodiment, the solder material may be formed from tin and silver. In another embodiment, the solder material may be formed from tin, silver, and bismuth.

The solder deposit is preferably of low volume. For example, the solder deposit may be between 80 to 250 microns thick, e.g. between 100 to 200 microns thick, or between 140 to 160 microns thick. The solder deposit may have a diameter of between 4 to 8 mm, e.g. between any one of 4, 5, 6, or 7 mm, to any one of 8, 7, 6, or 5 mm wide. The volume of the solder deposit may be between any one of 1.0, 2.0 3.0 4.0, 5.0, 6.0, 7.0, 8.0, 9.0, 10.0, 11.0, 12.0 to any one of 13.0, 12.0, 11.0, 10.0, 9.0, 8.0, 7.0, 6.0, 5.0, 4.0, 3.0, 2.0, for example, 1.0 $mm^2$ to 13.0 $mm^2$, e.g. between 2.0 to 11.0 $mm^2$ or between 3.0 to 9.0 $mm^2$, or 4.0 to 7.0 $mm^2$, or 5.0 to 6.0 $mm^2$.

A first and/or second aperture may be provided in the insulation. In embodiments the first and/or second aperture is located in or proximate the first and/or second foot portion. In an embodiment, the first and/or second aperture is provided on a second major surface.

The first and/or second aperture may have a smaller cross-sectional area than the corresponding first and/or second window.

The first and/or second aperture may be provided for applying a source of heat to the solder bridge, for example, to heat the solder material, for example to heat the solder material by conduction.

The solder bridge may further comprise an adhesive; the adhesive may be an adhesive tape, e.g., comprising an acrylic foam layer and acrylic adhesive on one or both major surfaces thereof. In embodiments, the adhesive tape may comprise or be a strip of VHB® tape, produced by 3M of St. Paul, Minn., USA. The adhesive tape may be located along a major surface of the solder bridge. In embodiments, the adhesive tape may be located at the first and/or second foot portion, for example, to promote pull strength.

The adhesive may be located proximate or adjacent the first and/or second window or aperture. In an embodiment the adhesive may at least partially, e.g. fully surround or circumscribe the insulation. In an embodiment the adhesive is provided on one side of the insulation, preferably the first major surface.

The solder bridge is suitable for use in a vehicle windscreen, e.g. a laminated screen. The vehicle windscreen may comprise a first transparent substrate and a second transparent substrate, e.g. a first and a second pane of glass. The vehicle windscreen may comprise an innermost transparent substrate (i.e. facing the interior of the vehicle) and an outermost transparent substrate (i.e. facing the external environment).

The first and second transparent substrates may be spaced apart to provide an intervening layer. The intervening layer may comprise a polyvinyl butyrate (PVB) layer. For example, the innermost layer may be thinner than the outermost layer. For example, the innermost layer may be between 1.5 to 3.5 mm thick, e.g. 2.0 to 3.0 mm thick, for example, between 2.0 to 2.8 mm thick. The outermost later may be between 1.8 to 4.0 mm thick, for example, between 2.0 to 3.5 mm thick, e.g. 2.5 to 3.0 mm thick.

Alternatively, the solder bridge is suitable for use in a vehicle windscreen comprising tempered glass, e.g. a toughened glass. The vehicle windscreen may be used as a rear windscreen, e.g. a rear vehicle windscreen comprising tempered glass.

A second aspect of the invention provides a pane, the pane comprising a transparent substrate having an electrically conductive structure provided thereon and an electrical connector having a flat electrically conductive body, a mounting portion and at least one connecting portion, the electrical connector being secured to the electrically conductive structure at the mounting portion, the mounting portion provided with encompassing insulation.

The flat electrically conductive body, the mounting portion and the at least one connecting portion may be formed as a unitary body.

It has been surprisingly found by the inventors that the use of an electrical connector in a pane, the electrical connector comprising a flat electrically conductive body with encompassing insulation according to the invention, provides an electrical connection to the electrically conductive substrate that is robust to environmental conditions that may be experienced by the pane in use, and which experiences significantly reduced residual stress between the transparent substrate and the electrical connector.

In embodiments, the transparent substrate of the pane may form part of a laminated vehicle windscreen. In embodiments, the transparent substrate of the pane may comprise tempered glass.

In embodiments, the critical stress area between the mounting portion and the pane may be less than $8 \times 10^{-4}$ mm$^2$, for example, less than $7 \times 10^{-4}$ mm$^2$, or less than $6 \times 10^{-4}$ mm$^2$, or less than $5 \times 10^{-4}$ mm$^2$, or less than $4 \times 10^{-4}$ mm$^2$, e.g. less than $3 \times 10^{-4}$ mm$^2$.

The electrical connector comprises at least one mounting portion, i.e. a portion for securing the electrical connector to the electrically conductive structure. In embodiments, the electrical connector may comprise two mounting portions, i.e. a first mounting portion, and a second mounting portion. In embodiments, the electrical connector may comprise more than two mounting portions, for example, three or more mounting portions. The electrical connector may be secured directly to the electrically conductive structure via the at least one mounting portion, for example, the electrical connector may be secured directly to the electrically conductive structure via a first and a second mounting portion.

The at least one connecting portion provides, in use, an electrical connection between the electrically conductive structure to a source of electrical power, e.g. the vehicle's electrical system. In embodiments, the electrical connector may comprise two or more connecting portions.

The connecting portion may further comprise a securement means, e.g. a potting compound, a crimped portion, e.g. crimped metal, or another means to secure the electrical connector to the source of electrical power.

In embodiments, the electrical connector may comprise more than one flat electrically conductive body, e.g. two or more flat electrically conductive bodies. For example, a first mounting portion may comprise a first flat electrically conductive body, and/or a second mounting portion may comprise a second flat electrically conductive body. In embodiments, the electrical connector may comprise n mounting portions and n flat electrically conductive bodies. In embodiments, each individual flat electrically conductive body may provide an individual electrical connection from the electrically conductive structure to a source of electrical power, e.g. the vehicle's electrical system Preferably, the electrical connector is flexible in use. As such, preferably the electrical connector is fabricated from any suitable conductive material that is flexible. For example, the electrical connector may comprise and/or be fabricated from a suitable metal, for example one of silver, copper, gold, aluminium. Clearly there is a balance between electrical conductivity on the one hand and cost of manufacture on the other. So, whilst silver and so on may be used, it is typically too expensive for mass manufacture and so we prefer to use copper.

The flat electrically conductive body may be fabricated from a metal strip or a metal foil, e.g. a copper, silver and/or gold strip, or a copper, silver, and/or gold foil.

The flat electrically conductive body of the electrical connector may be less than or equal to 100 microns thick, for example, between 50 to 100 microns thick, e.g. from 50 to 90 microns, or from 50 to 80 microns, for example, from 65 to 75 microns, e.g. 70 microns thick. In embodiments, the flat electrically conductive body of the electrical connector may be 40 to 100 microns thick, e.g. from 45 to 90 microns thick, or from 50 to 80 microns thick, for example, from 65 to 75 microns thick, e.g. 70 microns thick.

The flat electrically conductive body may be between 0.3 to 4.0 mm wide, e.g. from 0.4 to 3.0 mm wide, or from 0.5 to 2.0 mm wide. In embodiments, the flat electrically conductive body is between 0.5 to 1.5 mm wide, e.g. 1.0 mm wide.

The electrical connector may comprise a first end comprising one or more mounting portions, and a second end comprising one or more connecting portions.

The electrical connector may be from, say 30 to 150 mm long. The electrical connector may be from, say 6.0 to 25 mm wide; say 6.0 to 15 mm wide.

The first end of the electrical connector may be wider than the second end of the electrical connector. The first end may be a sufficient width to accommodate the one or more mounting portion(s) of the electrical connector. In an embodiment, an electrical connector comprises a first mounting portion and a second mounting portion at the first end, each of the first and second mounting portions comprising a flat electrically conductive body, the first end being from 6.0 to 25 mm wide and the second end being from 6.0 to 150 mm wide.

The electrical connector may comprise more than one conductive material, e.g. a metal provided as a substrate and coated with a cover layer. In embodiments, the substrate may be coated in a cover layer of a thickness of say 0.1 to 10 microns, for example, less than 5 microns thick, e.g. 2-4 microns thick. The cover layer may comprise one or more of tin and/or silver. The cover layer may comprise plural layers, for example in succession a layer of tin and a layer of silver, or vice versa.

The flat electrically conductive body is provided with encompassing insulation, e.g. electrical insulation. The encompassing insulation may protect against environmental damage. The encompassing insulation may be provided by a layer that encases all major surfaces of the flat electrically conductive body such that the electrical connector is at least substantially electrically insulated.

The encompassing insulation, that is the insulation material, may comprise or be any suitable material known to the skilled person. For example, the insulating portion may comprise or be a polymer, e.g. formed from a polymer resin. In embodiments, the encompassing insulation may comprise polyimide. Preferably, the insulation is a layer of temperature-stable plastics material, for example, polyimide. One such plastics material is polyimide. In embodiments, the insulation may be formed from Kapton® film supplied by E.I. Dupont of Delaware, USA.

The encompassing insulation may be a layer that is between 10 to 100 microns thick, for example, between 10 to 90 microns thick, or 10 to 80 microns thick, or 10 to 70 microns thick, or 10 to 60 microns thick, for example, between 10 to 50 microns thick, or 10 to 40 microns thick, or 10 to 30 microns thick, e.g. 20 to 30 microns thick, e.g. 25 microns thick. Preferably, the thickness of the encompassing insulation will be chosen so as to allow the electrical connector to retain its flexibility.

The encompassing insulation comprises a border, i.e. a portion that extends beyond the flexible electrically conductive body. The border may be, say between 0.5 to 2 mm wide, e.g. between 0.75 to 1.5 mm wide, or between 1.0 to 1.25 mm wide.

In embodiments, the total thickness of the flat electrically conductive body comprising encompassing insulation may be between 100 microns and 500 microns, for example, between 100 and 400 microns, between 100 and 300 microns, between 100 and 200 microns, or between 100 and 150 microns. Preferably, the total thickness of the flat electrically conductive body comprising encompassing insulation comprising insulation has a thickness of less than 200 microns, e.g. less than 180 microns, or less than 150 microns, e.g. less than or equal to 130 microns, for example, 120 microns.

The electrical connector is flat and has a first major surface and a second major surface. The first major surface may be the intended transparent-substrate-facing surface.

The insulation may comprise one or more opening(s) to expose the flat electrically conductive body of the electrical connector.

One or more opening(s) may be present in the insulation of the flat electrically conductive body for providing, in use, an electrical connection from the electrical connector to a source of electrical power, e.g. the vehicle's electrical system. The one or more opening(s) in the insulation may be present, for example, on the second major surface, for example, at the second end of the electrical connector, for example, at the connecting portion.

The encompassing insulation may comprise one or more window(s), e.g. a first window and a second window, to expose the flat electrically conductive body of the electrical connector.

The one or more window (s) may be located on or proximate the first end comprising one or more mounting portion(s) of the electrical connector.

In embodiments, the first window and/or the second window may be located to facilitate an electrical connection of the first and/or the second (where present) mounting portion(s) to the electrically conductive structure of the transparent substrate. For example, the first window and/or second window may be located on the first major surface of the electrical connector.

In use, the mounting portion for connection to the transparent substrate of the pane may be secured directly to the electrically conductive structure via a solder material, e.g. a solder deposit or a solder preform.

Preferably the solder material is lead-free. The solder compound may comprise one or more of silver, tin, bismuth, indium and copper. In one embodiment, the solder material may be formed from tin and silver. In another embodiment, the solder material may be formed from tin, silver, and bismuth.

The solder deposit is preferably of low volume. For example, the solder deposit may be between 80 to 250 microns thick, e.g. between 100 to 200 microns thick, or between 140 to 160 microns thick. The solder deposit may have a diameter of between 4 to 8 mm, e.g. between any one of 4, 5, 6, or 7 mm, to any one of 8, 7, 6, or 5 mm wide. The volume of the solder deposit may be between any one of 1.0, 2.0 3.0 4.0, 5.0, 6.0, 7.0, 8.0, 9.0, 10.0, 11.0, 12.0 to any one of 13.0, 12.0, 11.0, 10.0, 9.0, 8.0, 7.0, 6.0, 5.0, 4.0, 3.0, 2.0, for example, 1.0 mm$^2$ to 13.0 mm$^2$, e.g. between 2.0 to 11.0 mm$^{2'}$ or between 3.0 to 9.0 mm$^2$, or 4.0 to 7.0 mm$^2$, or 5.0 to 6.0 mm$^2$.

The one or more windows) may be covered with a or the solder material.

One or more aperture(s) may be provided in the insulation. In embodiments the one or more aperture(s) is located in or proximate the one or more mounting portion(s). In an embodiment, the one or more aperture(s) is provided on a second major surface of the electrical connector.

The one or more aperture(s) may have a smaller cross-sectional area than the corresponding one or more window(s).

The one or more aperture(s) may be provided for applying a source of heat to the solder bridge, for example, to heat the solder material.

The electrical connector may further comprise an adhesive, for example, an adhesive tape, e.g. comprising an acrylic foam layer and acrylic adhesive on one or both major surfaces thereof. The electrical connector may further comprise an adhesive tape applied to a major surface of the encompassing insulation. In embodiments, the adhesive tape may comprise or be a strip of VHB® tape, produced by 3M of St. Paul, Minn., USA. The adhesive tape may be applied, e.g. longitudinally applied, to a major surface of the electrical connector. In embodiments, the adhesive tape may be located proximate or adjacent the first end of the electrical connector, e.g. proximate or adjacent the mounting portion(s), for example, to promote pull strength.

The adhesive, e.g. the adhesive tape, may be located proximate or adjacent the one or more window(s), e.g. at the second end of the electrical connector. In an embodiment the adhesive may at least partially, e.g. fully surround or circumscribe the one or more window(s).

The pane according to the second aspect of the invention is suitable for use in a vehicle windscreen.

The electrically conductive structure disposed on the surface of the substrate may comprise silver, for example, the electrically conductive structure may comprise or be a silver track.

The electrically conductive structure may be printed onto the transparent substrate.

The transparent substrate may be glass, e.g. soda lime glass. Alternatively, other transparent substrates are known to the skilled person including quartz glass, borosilicate glass, and/or synthetic polymers.

The vehicle windscreen may comprise a first transparent substrate and a second transparent substrate, e.g. a first and a second pane of glass. The vehicle windscreen may comprise an innermost transparent substrate (i.e. facing the interior of the vehicle) and an outermost transparent substrate (i.e. facing the external environment).

The first and second transparent substrates may be spaced apart to provide an intervening layer. The intervening layer may comprise a polyvinyl butyrate (PVB) layer. For example, the innermost layer may be thinner than the outermost layer. For example, the innermost layer may be between 1.5 to 3.5 mm thick, e.g. 2.0 to 3.0 mm thick, for example, between 2.0 to 2.8 mm thick. The outermost later may be between 1.8 to 4.0 mm thick, for example, between 2.0 to 3.5 mm thick, e.g. 2.5 to 3.0 mm thick.

Alternatively, the pane according to the second aspect of the invention is suitable for use in a vehicle windscreen comprising tempered glass, e.g. a toughened glass. The vehicle windscreen may be used as a rear windscreen, e.g. a rear vehicle windscreen comprising tempered glass.

The pane may form part of a heated vehicle windscreen. The function of the electrically conductive structure may be to provide electrical power to heating elements, which run along or through the vehicle pane, e.g. through an intervening layer between a first and a second transparent substrate.

Within the scope of this application it is expressly intended that the various aspects, embodiments, examples and alternatives set out in the preceding paragraphs, in the claims and/or in the following description and drawings, and in particular the individual features thereof, may be taken independently or in any combination. That is, all embodiments and/or features of any embodiment can be combined in any way and/or combination, unless such features are incompatible. For the avoidance of doubt, the terms "may", "and/or", "e.g.", "for example" and any similar term as used herein should be interpreted as non-limiting such that any feature so-described need not be present. Indeed, any combination of optional features is expressly envisaged without departing from the scope of the invention, whether or not these are expressly claimed. The applicant reserves the right to change any originally filed claim or file any new claim accordingly, including the right to amend any originally filed claim to depend from and/or incorporate any feature of any other claim although not originally claimed in that manner.

BRIEF DESCRIPTION OF SEVERAL VIEWS OF THE DRAWINGS

The patent or application file contains at least one drawing executed in color. Copies of this patent or patent application publication with color drawing(s) will be provided by the Office upon request and payment of the necessary fee.

Embodiments of the invention will now be described by way of example only with reference to the accompanying drawings in which.

DETAILED DESCRIPTION OF PREFERRED EMBODIMENTS OF THE INVENTION

Figure 1A:
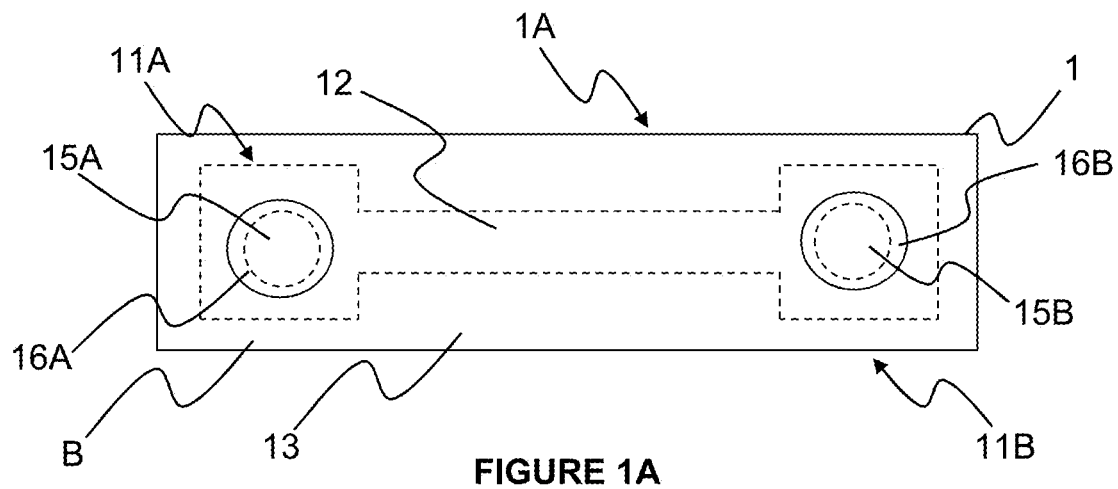
FIG. 1A is a plan view of the first major surface of a solder bridge according to a first embodiment of the invention.
Figure 1B:
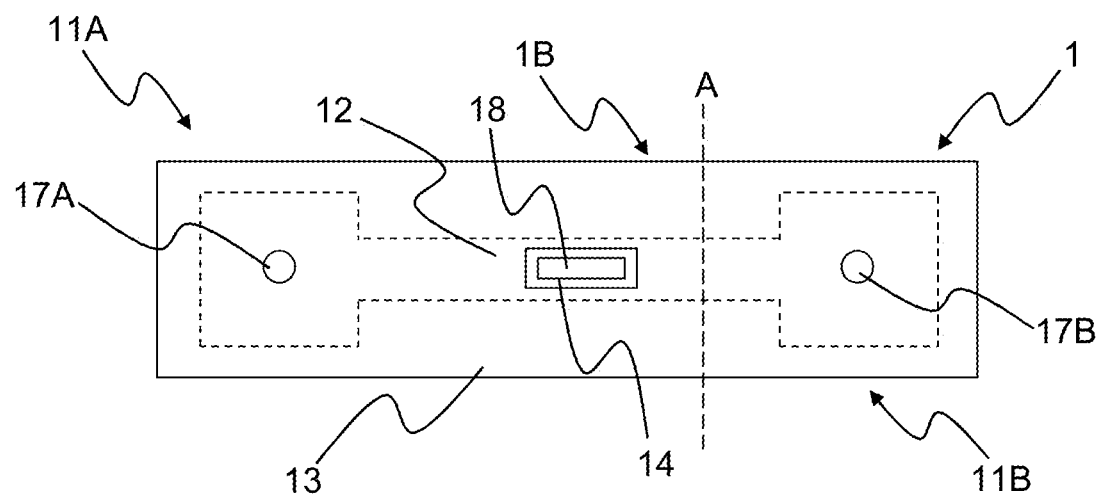
FIG. 1B is a plan view of the second major surface of the solder bridge of FIG. 1A.
Figure 1C:
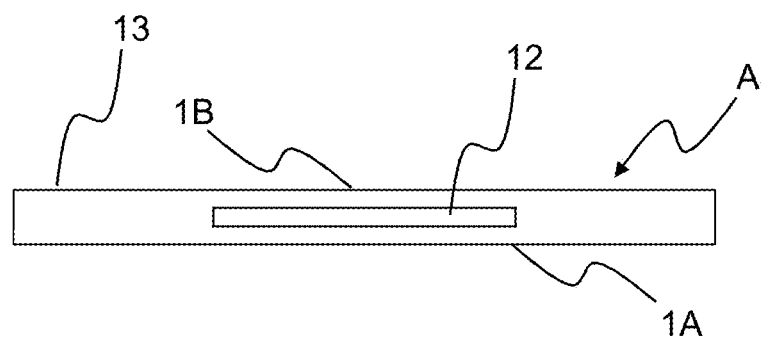
FIG. 1C is a cross-sectional view of the solder bridge of FIG. 1A.

Referring now to FIGS. 1A to 1C, there is shown a solder bridge 1 according to a first embodiment of the invention. The solder bridge 1 comprises a first major surface 1A (shown in FIG. 1A) for facing a substrate, for example a windscreen pane, in use, and a second major surface 1B (shown in FIG. 1B).

The solder bridge 1 comprises a first foot portion 11A, a second foot portion 11B, a conductive portion 12, encapsulating insulation 13, and a connecting portion 14.

The first foot portion 11A, second foot portion 11B and conductive portion 12 are integrally formed as a unitary body. As shown, the first foot portion 11A, second foot portion 11B and conductive portion 12 provide a dumb-bell-type shape, each of the first and second foot portion 11A, 12A extending transversely beyond the periphery of the conductive portion 12. The first foot portion 11A and second foot portion 11B are shown as being rectangular, e.g. square, in plan although other shapes (circular, triangular and so on can be deployed). As above, in each case the foot portions 11A, 11B will preferably extend transversely beyond the conductive portion 12.

The first foot portion 11A comprises a first window 15A through the insulation 13, and the second foot portion 11B comprises a second window 15B through the insulation 13, both on the first major surface 1A of the solder bridge 1. The first window 15A is provided with a first solder deposit 16A, and the second window 15B of the second foot portion 11B is provided with a second solder deposit 16B, both on the first major surface 1A of the solder bridge 1.

As shown in FIG. 1A, the solder deposit 16A, 16B is larger than the corresponding first window 15A, and second window 15B, although it may be smaller or the same size. Preferably each of the solder deposits 16A, 16B covers a respective window 15A, 15B to prevent (or at least inhibit) any environmental or other damage to the underlying foot portion 11A, 11B.

The insulation 13 provides a border B that extends beyond the periphery of the first and second foot portions 11A, 11B and the conductive portion 12 to provide protection to the conductive portion 12 from damage by the external environment. The insulation 13 comprises a first aperture 17A, a second aperture 17B, and an opening 18 on the second major surface 1B of the solder bridge 1.

In FIG. 1C, there is shown a view of the cross-section A of the solder bridge 1 shown in FIG. 1B. The insulation 13 encloses or encompasses the conductive portion 12 of the solder bridge 1, such that the conductive portion 12 is exposed at the locations of the first and second windows 15A, 15B, the first and second apertures 17A, 17B, and the opening 18 only.

In this embodiment, the conductive portion 11 forms a flexible electrically conductive body and the solder bridge 1 is flat.

The first and second foot portions 11A, 11B are, in use, each secured directly to an electrically conductive structure (not shown) of, say, a windscreen, via the solder deposits 16A, 16B.

The opening 18 in the insulation 13 exposes the conductive portion 12 at the connecting portion 14 of the solder bridge 1, which provides, in use, an electrical connection from the solder bridge 1 to a source of electrical power. The connecting portion 14 may be connected to a cable (not shown) to provide an electrical connection from the electrical system of the vehicle to the electrically conductive structure (not shown).

During manufacture of a vehicle windscreen, the first major surface 1A of the solder bridge 1 is presented against an electrically conductive structure (not shown) on a fragile substrate such as a windscreen (not shown). Heat energy is applied to the first and second apertures 17A, 17B, which is transmitted to the solder deposits 16A, 16B causing the solder deposits 16A, 16B to melt and flow between the fragile substrate and the conductive portion 12 at the first and second windows 15A, 15B located on the first and second foot portions 11A, 11B of the solder bridge 1. The heat energy is then removed from the first and second apertures 17A, 17B, causing the solder deposits 16A, 16B to solidify and hence secure the solder bridge 1 to the electrically conductive structure of the fragile substrate. The connecting portion 14 may then be connected to the source of electrical power within the vehicle.

In a most preferred embodiment, the solder bridge 1 is formed from a copper foil, e.g. thickness of 70 micron, encased in an insulation 13 provided by a polyimide layer on each side of the solder bridge with e.g. thickness of 25 microns, such that the solder bridge 1 has a total thickness of approximately 120 microns. In a preferred embodiment, the solder bridge 1 has a length of approximately 60 mm and a width of approximately 10 mm.

Preferably the solder deposits 16A, 16B are lead free. For example, a suitable solder composition consists of 96.5% tin, 3% silver, and 0.5% copper (e.g. marketed as SAC305 by AIM Solder of Luton, UK).

Preferably, the solder deposits 16A, 16B are approximately 5 mm in diameter, and approximately 100 to 200 microns thick, such that the volume of solder is relatively small.

Advantageously, the selection of material types and thicknesses used to form the solder bridge 1 enable the solder bridge 1 to be flexible, i.e. it is capable of bending easily without breaking or being damaged. Advantageously, this enables the solder bridge 1 to provide an electrical connection to a transparent substrate whilst substantially reducing stress when they are soldered onto the transparent substrate.

More advantageously, the conductive portion 12 of the solder bridge 1 is thin, which enables rapid heat transferal from the first and/or second apertures 17A, 17B through the conductive portion 12, and into the solder deposits 16A, 16B. In addition, the solder deposits 16A, 16B are thin (e.g. between 100 to 200 microns) and of low volume. The thin conductive portion 12 enables heat to be transferred rapidly to melt the solder to secure the solder bridge 1 to a fragile substrate during manufacture. The solder deposit 16A, 16B are of low volume, which means that the solder will rapidly cool. This, the heat energy applied to secure the solder bridge 1 to a windscreen is low and the thermal insult to the fragile substrate is low.

The solder bridge 1 may further comprise an adhesive portion (e.g. an adhesive tape) to help secure the solder bridge to a substrate in use. The adhesive portion may surround the first window 15A and/or the second window 15B and/or be located between the first and second foot portions 11A, 11B.

Figure 2:
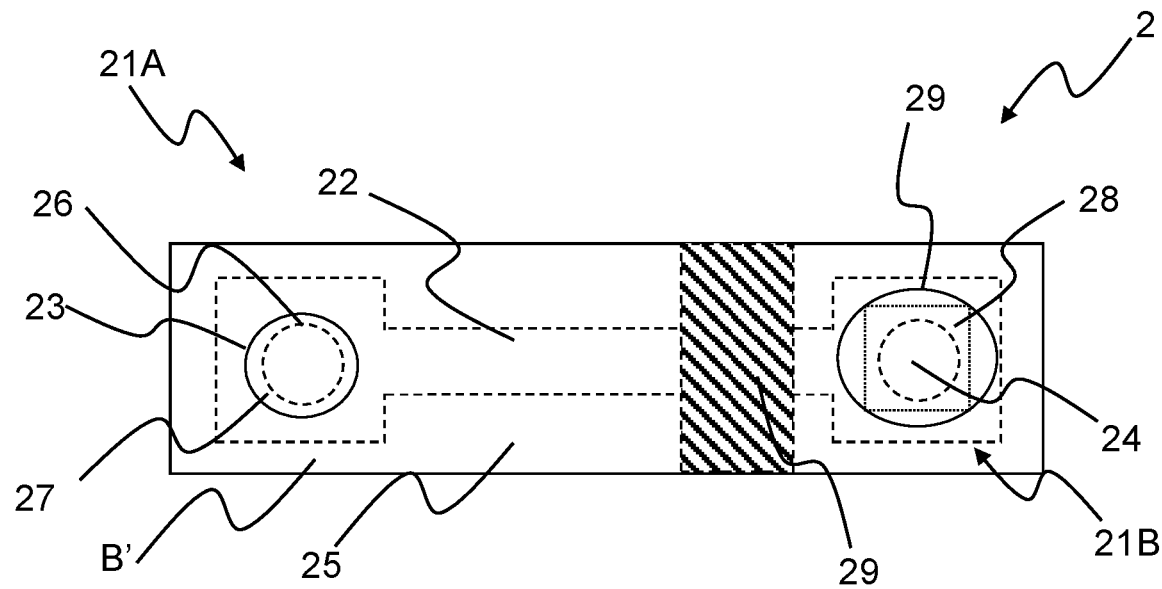
FIG. 2 is a plan view of the first major surface of an electrical connector according to a second embodiment of the invention.

Referring now to FIG. 2, there is shown an electrical connector 2 according to a further embodiment of the invention. Only the first major surface is shown 2A, which is the substrate-facing surface, for example a transparent-substrate-facing surface.

The electrical connector 2 comprises a first end 21A and a second end 21B.

The electrical connector 2 comprises a flat electrically conductive body 22, a mounting portion 23, a connecting portion 24, and insulation 25.

The mounting portion 23 and the connecting portion 24 are both located on the first major surface 2A of the electrical connector 2. The mounting portion 23 is located at the first end 21A and the connecting portion 24 is located at the second end 21B of the electrical connector 2.

The flat electrically conductive body 22, the mounting portion 24, and the connecting portion 25 are formed as a unitary body.

The insulation 25 comprises a window 26, located at or proximate the mounting portion 23.

The mounting portion 23 is provided with a solder deposit 27 on the first major surface 2A of the electrical connector 2. The solder deposit 27 preferably covers the window 26 so as to ensure that the otherwise exposed part of the foot portion 11A is not exposed.

The insulation 25 further comprises an window or opening 28 located at or proximate the connecting portion 24 on the first major surface 2A of the electrical connector 2.

The connecting portion 24 may further comprise a potting compound 29 to provide protection to the electrical connection formed between the electrical connector 2 and the electrically conductive structure of the transparent substrate of the pane.

The insulation 25 extends beyond the periphery of the electrically conductive body 22, mounting portion 23, and connecting portion 34 to define a border B' and such that the mounting portion 23 and connecting portion 34 are exposed via the second window 26 and the window or opening 28 only, for example to provide protection to damage from the external environment.

In this embodiment, the insulative portion 25 is further provided with an adhesive tape 29. Advantageously, addition of the adhesive tape 29 increases pull-strength of the electrical connector 2.

In use, the mounting portion 23 is secured directly to an electrically conductive structure (not shown) of a transparent substrate of a pane via the solder deposit 27.

The window or opening 28 in the insulation 25 exposes the connecting portion 24 of the electrical connector 2, which provides, in use, an electrical connection from the electrical connector 2 to a source of electrical power. The connecting portion 24 may each be connected to a cable (not shown) to provide an electrical connection from the electrical system of the vehicle to the electrically conductive structure (not shown).

In embodiments, the electrical connector 2 may be provided with one or more openings or apertures (not shown) located on the opposite side of the electrical connector 2 to the solder deposit 27. The electrical connector 2 may be connected during manufacture to the electrically conductive structure of the transparent substrate of the pane via the solder deposit 27 at the mounting portion 23 in a like-manner to that described for the solder bridge 1 of FIGS. 1A,1B.

Advantageously, the selection of material types and thicknesses used to form the electrical connector 2 enable the electrical connector 2 to be flexible, i.e. it is capable of bending easily without breaking or being damaged. Advantageously, this enables the electrical connector 2 to provide an electrical connection to a transparent substrate whilst substantially reducing stress when they are soldered onto the transparent substrate.

Figure 3:
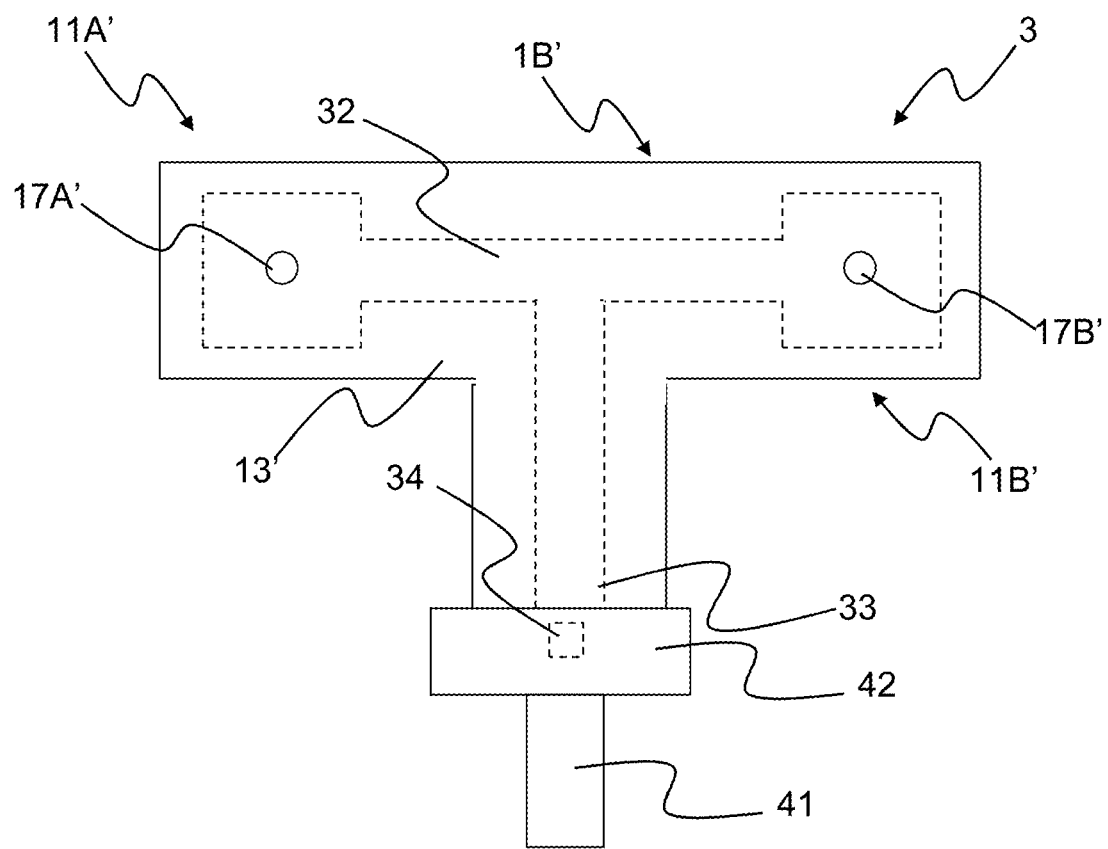
FIG. 3 is a plan view of a solder bridge according to a third embodiment of the invention.

Referring now to FIG. 3, there is shown a solder bridge 3 according to a third embodiment of the invention. The solder bridge 3 has many features in common with the solder bridge 1 of FIGS. 1A-1C, and like-references are designated with a prime (') and will not be described further. Only the features that differ from those described for solder bridge 1 of FIGS. 1A-1C are further described.

In this embodiment, the solder bridge 3 comprises a conductive portion 32 that is substantially T-shaped. The solder bridge 3 comprises a connecting portion 34, which is located towards the base portion or foot 33 of the T-shaped conductive portion 32.

The solder bridge 3 is shown to be electrically connected by the connecting portion 34 to a cable 41 via a plug 42. In use, the connecting portion 34 is connected to the vehicle's electrical system via the cable 41.

Figure 4:
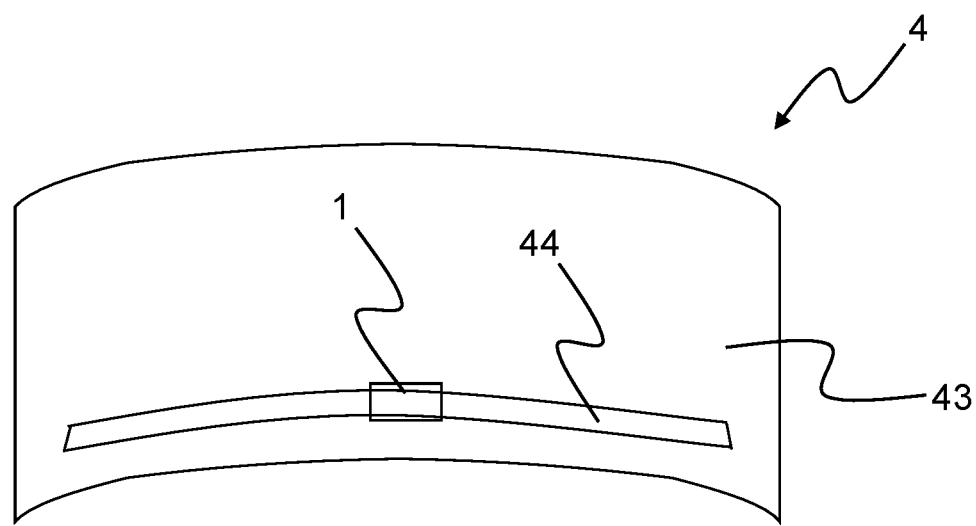
FIG. 4 is a schematic of a vehicle windscreen comprising the solder bridge of FIG. 1A, or FIG. 3, or the electrical connector of FIG. 2.

Referring now to FIG. 4, there is shown a vehicle windscreen 4 comprising a pane 43 which is a fragile and transparent substrate. The pane 43 comprises an electrically conductive structure 44 and the solder bridge 1 of FIG. 1A-1C, or FIG. 3, or the electrical connector of FIG. 2. It is shown that the solder bridge 1 or the electrical connector 2 is connected to the electrically conductive structure 44 by the first and second foot portions (not shown).

To further exemplify the invention, reference is made to the following non-limiting Examples.

Example 1

An electrical connector was fabricated in accordance with the above description and as shown in FIG. 2. The electrical connector was formed from a copper foil of a thickness of 70 micron, encased in an insulative layer provided by a polyimide Kapton® tape, of a thickness of 25 microns. The solder deposit was provided as SAC305 by AIM Solder of Luton, UK in a thickness of 100 microns.

The electrical connector has a total thickness of approximately 120 microns, a length of approximately 105 mm, and a width of approximately 9 mm.

Figure 5:
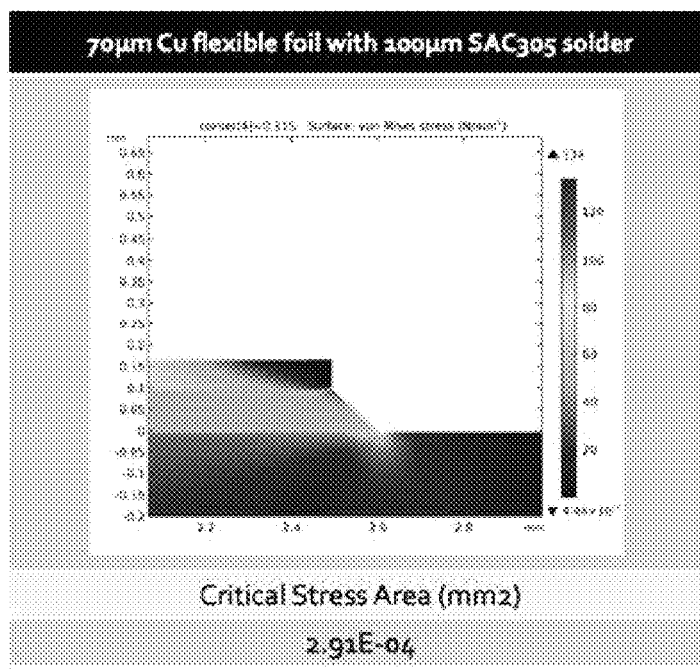
FIG. 5 is a graph showing the critical stress area of a connector according to an Example of the invention.

Referring now to FIG. 5, there is shown a von Mises stress model 3 for the electrical connector fabricated in Example 1 when connected to a fragile substrate, e.g. glass. It is shown that the critical stress area for the electrical connection between the electrical connector and the transparent substrate is $2.91 \times 10^{-4}$ mm$^2$.

Comparative Example 1

A prior art solder bridge was fabricated. The electrical connector had a thickness of 0.4 mm and was rigid. The solder deposit was provided as SAC305 by AIM Solder of Luton, UK in a thickness of 200 microns.

Figure 6:
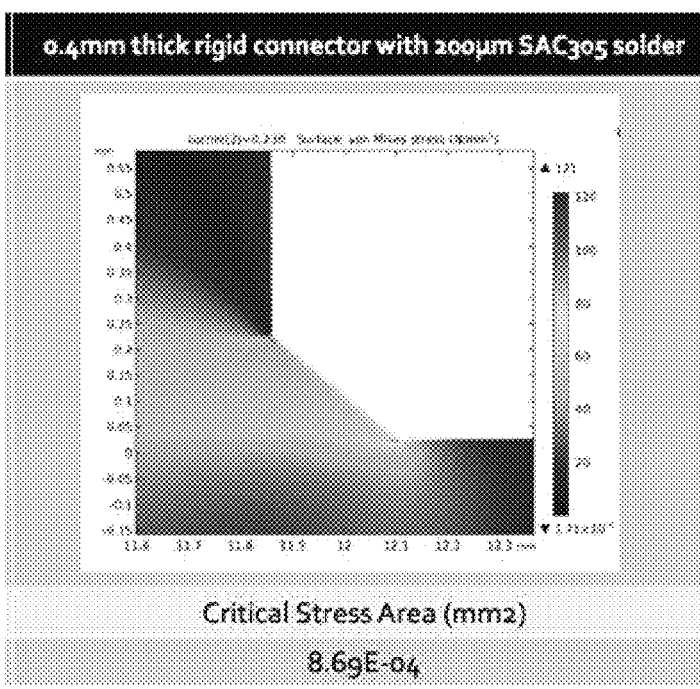
FIG. 6 is a graph showing the critical stress area of a connector according to a Comparative Example of the invention.

Referring now to FIG. 6, there is shown a von Mises stress model 4 for the electrical connector fabricated for Comparative Example 1 when connected to a fragile substrate, e.g. glass. It is shown that the critical stress area for the electrical connection between the electrical connector and the transparent substrate is $8.69 \times 10^{-4}$ mm$^2$.

The results show a 67% reduction in the critical stress area at the solder-glass interface for Example 1 in comparison with Comparative Example 1.

It will be appreciated by those skilled in the art that several variations to the aforementioned embodiments are envisaged without departing from the scope of the invention. It will also be appreciated by those skilled in the art that any number of combinations of the aforementioned features and/or those shown in the appended drawings provide clear advantages over the prior art and are therefore within the scope of the invention described herein.

What is claimed is:

1. A solder bridge for a vehicle windscreen, the solder bridge comprising a first major surface and a second major surface and further comprising a first foot portion for electrical connection to a vehicle windscreen and a second foot portion for electrical connection to a vehicle windscreen, the first foot portion and second foot portion being interconnected by a flexible electrically conductive body provided with insulation, wherein the first foot portion and the second foot portion are provided with insulation, a first window in the insulation is provided at the first foot portion on the first major surface and a second window in the insulation is provided at the second foot portion on the first major surface, and at least one aperture is provided in the insulation on the second major surface in or proximate the first and/or second foot portion, wherein the at least one aperture is smaller in cross-sectional area than the corresponding first and/or second window.

2. A solder bridge according to claim 1, wherein the flexible electrically conductive body comprises a connecting portion for providing, in use, an electrical connection from the solder bridge to a source of electrical power, e.g. the vehicle's electrical system.

3. A solder bridge according to claim 2, wherein the flexible electrically conductive body is formed as a unitary body comprising the connecting portion, the first foot portion, and the second foot portion.

4. A solder bridge according to claim 1, wherein the flexible electrically conductive body is fabricated from a metal foil.

5. A solder bridge according to claim 1, wherein the flexible electrically conductive body has a thickness of less than 100 microns.

6. A solder bridge according to claim 1, wherein the insulation is provided as a layer fabricated from a polymer.

7. A solder bridge according to claim 1, wherein the insulation is between 10 to 100 microns thick.

8. A solder bridge according to claim 1, wherein the insulation extends beyond the periphery of the flexible electrically conductive body to provide a border.

9. A solder bridge according to claim 1, further comprising an adhesive tape applied to a major surface.

10. A solder bridge according to claim 1, wherein the first foot portion and the second foot portion extend transversely beyond the periphery of the flexible electrically conductive body.

11. A pane, the pane comprising a transparent substrate having an electrically conductive structure provided thereon and an electrical connector having at least one mounting portion, at least one connecting portion, and a flat electrically conductive body, the electrical connector being secured to the electrically conductive structure at the mounting portion, wherein the mounting portion and the flat electrically conductive body is covered in encompassing insulation material and has an exposed portion on a first major surface of the electrical conductor and an aperture is provided in or proximate the at least one mounting portion on a second major surface of the electrical conductor, the aperture having a smaller cross-sectional area than the exposed portion, wherein the mounting portion extends transversely beyond the periphery of the flat electrically conductive body.

12. A pane according to claim 11, wherein the electrical connector is fabricated from a conductive material, for example, a metal foil.

13. A pane according to claim 11, wherein the flat electrically conductive body of the electrical connector has a thickness of between 40 to 100 microns.

14. A pane according to claim 11, wherein the insulation material comprises polyimide.

15. A pane according to claim 11, wherein the insulation material is between 10 to 100 microns thick.

16. A pane according to claim 11, wherein the insulation material extends beyond the mounting portion and connecting portion to provide a border.

17. A pane according to claim 11, wherein the total thickness of the flat electrically conductive body comprising encompassing insulation is between 100 microns and 500 microns thick.

18. A solder bridge according to claim 1, wherein a solder preform is applied to the first foot portion and the second foot portion in the region of the window, and the solder preform is larger than the window to provide environmental protection to the underlying foot portion.

19. A solder bridge according to claim 1, further comprising an opening in the insulation of the flexible electrically conductive body for providing, in use, an electrical connection between the solder bridge and a source of electrical power.

20. A solder bridge for a vehicle windscreen, the solder bridge comprising a first major surface and a second major surface and further comprising a first foot portion for electrical connection to a vehicle windscreen and a second foot portion for electrical connection to a vehicle windscreen, the first foot portion and second foot portion being interconnected by a flexible electrically conductive body provided with insulation, a first window in the insulation is provided at the first foot portion on the first major surface and a second window in the insulation is provided at the second foot portion on the first major surface, and wherein a solder preform is applied to the first foot portion and the second foot portion in the region of the window, and the solder preform is larger than the window to provide environmental protection to the underlying foot portion.

* * * * *